United States Patent
Oya et al.

(10) Patent No.: US 9,209,350 B2
(45) Date of Patent: Dec. 8, 2015

(54) METHOD FOR FABRICATING TRIANGULAR PRISMATIC M-PLANE NITRIDE SEMICONDUCTOR LIGHT-EMITTING DIODE

(71) Applicant: Panasonic Corporation, Osaka (JP)

(72) Inventors: Mitsuaki Oya, Osaka (JP); Toshiya Yokogawa, Nara (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 14/497,622

(22) Filed: Sep. 26, 2014

(65) Prior Publication Data
US 2015/0200330 A1    Jul. 16, 2015

(30) Foreign Application Priority Data
Jan. 10, 2014   (JP) ................................ 2014-002893

(51) Int. Cl.
*H01L 33/00* (2010.01)
*H01L 33/24* (2010.01)
*H01L 33/32* (2010.01)

(52) U.S. Cl.
CPC ............ *H01L 33/0075* (2013.01); *H01L 33/24* (2013.01); *H01L 33/32* (2013.01)

(58) Field of Classification Search
CPC .............................. H01L 33/075; H01L 33/24
See application file for complete search history.

(56) References Cited

U.S. PATENT DOCUMENTS

| | | | |
|---|---|---|---|
| 5,929,465 A * | 7/1999 | Nee et al. .................... | 257/95 |
| 6,613,461 B1 * | 9/2003 | Sugahara ..................... | 428/698 |
| 2001/0030328 A1 | 10/2001 | Ishida | |
| 2001/0048114 A1 | 12/2001 | Morita et al. | |
| 2002/0028564 A1 | 3/2002 | Motoki et al. | |
| 2002/0063258 A1 * | 5/2002 | Motoki ........................ | 257/95 |
| 2003/0132508 A1 | 7/2003 | Ishida | |
| 2003/0205783 A1 | 11/2003 | Ishida | |
| 2009/0008654 A1 * | 1/2009 | Nagai ........................... | 257/88 |
| 2009/0050917 A1 * | 2/2009 | Nakagawa et al. .......... | 257/98 |
| 2010/0002738 A1 | 1/2010 | Takakura et al. | |
| 2013/0037825 A1 * | 2/2013 | Hiraiwa et al. .............. | 257/79 |
| 2013/0126902 A1 | 5/2013 | Isozaki et al. | |
| 2013/0146928 A1 | 6/2013 | Inoue et al. | |
| 2015/0162495 A1 | 6/2015 | Inoue et al. | |

FOREIGN PATENT DOCUMENTS

| | | |
|---|---|---|
| JP | 10-275933 | 10/1998 |
| JP | 10-335750 | 12/1998 |

(Continued)

*Primary Examiner* — Lex Malsawma
(74) *Attorney, Agent, or Firm* — McDermott Will & Emery LLP

(57) ABSTRACT

When a belt-like nitride semiconductor stacking structure 110 having a principal plane of an m-plane is broken along a linear groove 104, two or more side surfaces may be formed on the lateral side thereof. This decreases the fabrication efficiency of the triangular prismatic m-plane nitride semiconductor light-emitting diode. To solve this problem, Angle X of not less than 75 degrees and not more than 105 degrees is formed between the linear groove 104 and one cleavage axis selected from the group consisting of an a-axis and a c-axis. Then, the belt-like nitride semiconductor stacking structure 110 was broken along the linear groove 104 to form a quadratic prismatic nitride semiconductor stacking structure 120. Subsequently, the quadratic prismatic nitride semiconductor stacking structure 120 is broken along another linear groove 106 to obtain a triangular prismatic m-plane nitride semiconductor light-emitting diode 130.

14 Claims, 25 Drawing Sheets

(56) References Cited

FOREIGN PATENT DOCUMENTS

| | | |
|---|---|---|
| JP | 11-340507 | 12/1999 |
| JP | 2001-177146 | 6/2001 |
| JP | 2001-230497 | 8/2001 |
| JP | 2002-029897 | 1/2002 |
| JP | 2009-071174 | 4/2009 |
| JP | 2010-016092 | 1/2010 |
| JP | 2012-023249 | 2/2012 |
| WO | 2012/137406 | 10/2012 |

* cited by examiner

METHOD FOR FABRICATING TRIANGULAR PRISMATIC M-PLANE NITRIDE SEMICONDUCTOR LIGHT-EMITTING DIODE

BACKGROUND

1. Field of the Invention

The present invention relates to a method for fabricating a triangular prismatic m-plane nitride semiconductor light-emitting diode.

2. Description of the Related Art

Recently, a nitride semiconductor light-emitting diode having a principal plane of an m-plane has been researched and developed actively to improve the light-emitting efficiency. This is because a nitride semiconductor light-emitting diode having a principal plane of an m-plane is free from piezoelectric field, which decreases light-emitting efficiency. Hereinafter, a nitride semiconductor light-emitting diode having a principal plane of an m-plane is referred to as "m-plane nitride semiconductor light-emitting diode".

US Pre-Grant Patent Application Publication No, 2013/0126902A discloses an m-plane nitride semiconductor light-emitting diode. As shown in FIG. 21, this m-plane nitride semiconductor light-emitting diode comprises an n-side electrode 30, an n-type nitride semiconductor layer 21, an active layer 22, a p-type nitride semiconductor layer 23, and a p-side electrode 40. A voltage is applied between the n-side electrode 30 and the p-side electrode 40 to emit light from the active layer 22.

According to the paragraphs [0161]-[0166] of US Pre-Grant Patent Application Publication No. 2013/0126902A, this m-plane nitride semiconductor light-emitting diode is fabricated as below. First, the n-type nitride semiconductor layer 21, the active layer 22, and the p-type nitride semiconductor layer 23 are epitaxially grown in this order on a substrate 10.

Then, a portion of the n-type nitride semiconductor layer 21, the active layer 22 and the p-type nitride semiconductor layer 23 is removed by dry etching using a chlorine-based gas to expose a part of the n-type nitride semiconductor layer 21. The p-side electrode 40 and the n-side electrode 30 are formed on the p-type nitride semiconductor layer 23 and the exposed part of the n-type nitride semiconductor layer 21, respectively.

Japanese Patent Application laid-open Publication No. 2012-023249A discloses a triangular prismatic m-plane nitride semiconductor light-emitting diode shown in FIG. 22. See FIG. 3G included in Japanese Patent Application laid-open Publication No. 2012-023249A. According to the paragraph [0199] of Japanese Patent Application laid-open Publication No. 2012-023249A, the lengths of the three sides of a triangle viewed in the top view of this triangular prismatic m-plane nitride semiconductor light-emitting diode are different from one another to improve light extraction efficiency.

Japanese Patent Application laid-open Publication No. 2009-071174A discloses a triangular prismatic m-plane nitride semiconductor light-emitting diode shown in FIG. 23. See FIG. 20 included in Japanese Patent Application laid-open Publication No. 2009-071174A. As shown in FIG. 23, the triangle viewed in the top view of the light-emitting diode disclosed in Japanese Patent Application laid-open Publication No. 2009-071174A is an isosceles right triangle. The longer side 1a of the isosceles right triangle is included in one cleavage surface selected from the group consisting of an a-plane and a c-plane.

Japanese Patent Application laid-open Publication No. Hei 11-340507A discloses a triangular prismatic c-plane nitride semiconductor light-emitting diode shown in FIG. 24. See FIG. 1 included in Japanese Patent Application laid-open Publication No. Hei 11-340507A. Note that the principal plane of the triangular prismatic nitride semiconductor light-emitting diode disclosed in Japanese Patent Application Laid-open Publication No. Hei 11-340507A is not an m-plane but a c-plane. A nitride semiconductor layer having a principal plane of a c-plane has cleavage surfaces of a (−1010) plane, a (01-10) plane, and a (1-100) plane. Japanese Patent Application laid-open Publication No. Hei 11-340507A discloses breaking a nitride semiconductor stacking structure having a principal plane of a c-plane along these three cleavage surfaces. In this way, provided is a triangular prismatic c-plane nitride semiconductor light-emitting diode.

SUMMARY

The method of the present invention is a method for fabricating a triangular prismatic nitride semiconductor light-emitting diode, the method comprising:

(a) preparing a plate-like nitride semiconductor stacking structure comprising an n-type nitride semiconductor layer, an active layer, and a p-type nitride semiconductor layer, wherein the active layer is interposed between the n-type nitride semiconductor layer and the p-type nitride semiconductor layer;

the plate-like nitride semiconductor stacking structure has a principal plane of an m-plane;

the principal plane has a first linear groove, a second linear groove, and a third linear groove;

the first linear groove, the second linear groove, and the third linear groove form a triangle in a top view;

the first linear groove has a longitudinal direction substantially parallel to one cleavage axis selected from the group consisting of an a-axis and a c-axis; and the following formulae (I) to (III) are satisfied:

$$75 \text{ degrees} \leq \text{Angle } X \leq 105 \text{ degrees} \quad \text{(I)}$$

$$20 \text{ degrees} \leq \text{Angle } Y \quad \text{(II)}$$

$$20 \text{ degrees} \leq \text{Angle } Z \quad \text{(III)}$$

where

Angle X represents an angle formed between the cleavage axis and a longitudinal direction of the second linear groove;

Angle Y represents an angle formed between the longitudinal direction of the first linear groove and a longitudinal direction of the third linear groove; and Angle Z represents an angle formed between the longitudinal direction of the second linear groove and the longitudinal direction of the third linear groove;

(b) breaking the plate-like nitride semiconductor stacking structure, which has been prepared in the step (a), along the first linear groove to form a belt-like nitride semiconductor stacking structure, wherein the belt-like nitride semiconductor stacking structure has a first side surface on a first lateral side thereof; and the first side surface is parallel to the longitudinal direction of the first linear groove;

(c) breaking the belt-like nitride semiconductor stacking structure, which has been formed in the step (b), along the second linear groove to form a quadratic prismatic nitride semiconductor stacking structure, wherein the quadratic prismatic nitride semiconductor stacking structure has the first side surface on the first lateral side thereof and a second side surface on a second lateral side thereof; and the second side surface is parallel to the longitudinal direction of the second linear groove; and (d) breaking the quadratic prismatic nitride semiconductor stacking structure, which has been formed in the step (c), along the third linear groove to form the triangular prismatic nitride semiconductor light-emitting diode, wherein the triangular prismatic nitride semiconductor light-emitting diode has the first side surface on the first lateral side thereof, the second side surface on the second lateral side thereof, and a third side surface on a third lateral side thereof, and the third side surface is parallel to the longitudinal direction of the third linear groove.

The spirit of the present invention includes a triangular prismatic nitride semiconductor light-emitting diode comprising an n-type nitride semiconductor layer, a p-type nitride semiconductor layer, and an active layer which is interposed between the n-type nitride semiconductor layer and the p-type nitride semiconductor layer, the triangular prismatic nitride semiconductor light-emitting diode comprising:

a first side surface, a second side surface, and a third side surface which are respectively formed on a first lateral side, a second lateral side, and a third lateral side of the triangular prismatic nitride semiconductor light-emitting diode, wherein a triangle is composed of the first side surface, the second side surface, and the third side surface in a top view;

the first side surface is substantially parallel to one cleavage surface selected from the group consisting of an a-plane and a c-plane;

the triangular prismatic nitride semiconductor light-emitting diode has a principal plane of an m-plane; and the formulae (I) to (III) are satisfied.

The present invention provides a method for fabricating a triangular prismatic m-plane nitride semiconductor light-emitting diode efficiently.

DETAILED DESCRIPTION OF THE EMBODIMENT

Definition of the Terms

The term "nitride semiconductor" used in the present specification means a compound represented by the chemical formula $Al_xIn_yGa_{1-x-y}N$ (0≤x, 0≤y).

The term "top view" used in the present specification means a view seen from a normal direction of a stacking structure. Specifically, the term "top view" means a view seen from a normal direction of an active layer interposed between an n-type nitride semiconductor layer and a p-type nitride semiconductor layer which are included in a nitride semiconductor light-emitting diode.

A plate-like m-plane nitride semiconductor stacking structure is broken along three grooves which have been formed on the principal plane. In this way, a triangular prismatic m-plane nitride semiconductor light-emitting diode is fabricated. When a plate-like m-plane nitride semiconductor stacking structure is broken along one groove, it is required to form only one side surface on the lateral side thereof.

However, when a plate-like m-plane nitride semiconductor stacking structure is broken along one groove, two or more side surfaces may be formed on the lateral side thereof, as demonstrated in the comparative example 1, which will be described later. See FIG. 19 and FIG. 20, which will be described later. This is because the plate-like m-plane nitride semiconductor stacking structure has not been broken along the groove appropriately. As a result, the obtained m-plane nitride semiconductor light-emitting diode is not triangular prismatic. This decreases the fabrication efficiency of the triangular prismatic m-plane nitride semiconductor light-emitting diode.

An object of the present invention is to provide a method for fabricating a triangular prismatic m-plane nitride semiconductor light-emitting diode efficiently.

An embodiment of the present invention is described below in detail with reference to the drawings.

(Step (a))

Figure 1:
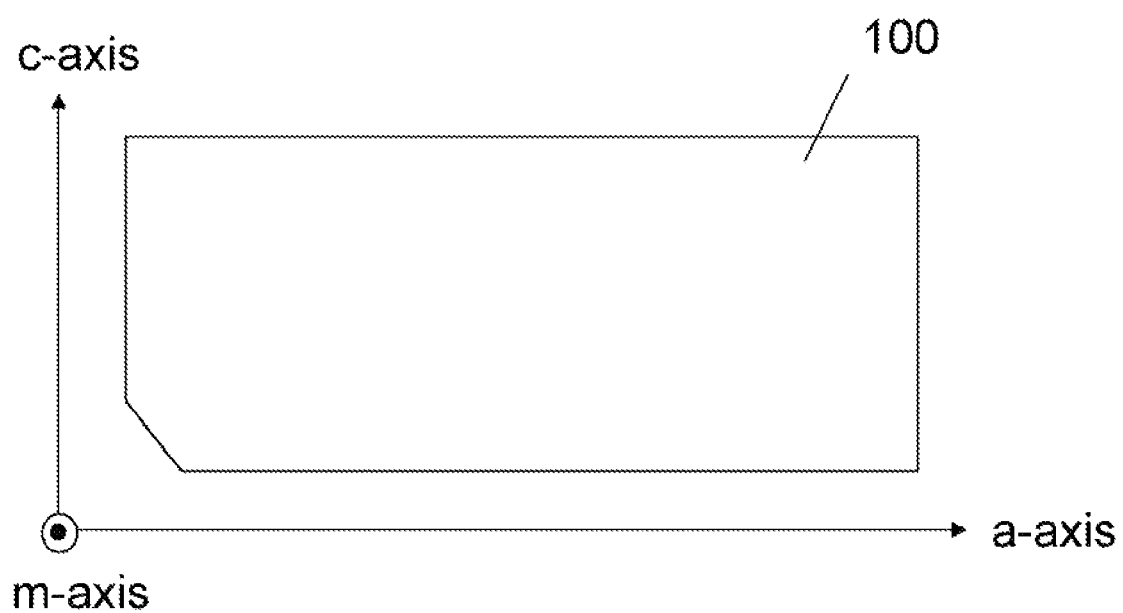
FIG. 1 shows a top view of a plate-like nitride semiconductor stacking structure 100 prepared in the step (a).

First, the step (a) will be described. As shown in FIG. 1, a plate-like nitride semiconductor stacking structure 100 is prepared in the step (a). Similarly to a conventional nitride semiconductor light-emitting diode, this plate-like nitride semiconductor stacking structure 100 comprises an n-type nitride semiconductor, an active layer, and a p-type nitride semiconductor layer. The active layer is stacked on the n-type nitride semiconductor layer. The p-type nitride semiconductor layer is stacked on the active layer. Therefore, the active layer is interposed between the n-type nitride semiconductor layer and the p-type nitride semiconductor layer. An n-side electrode and a p-side electrode are formed on the n-type nitride semiconductor layer and the p-type nitride semiconductor layer, respectively. FIG. 1 does not show the n-type nitride semiconductor layer, the active layer, the p-type nitride semiconductor layer, the p-side electrode, and the n-side electrode.

The plate-like nitride semiconductor stacking structure 100 has a principal plane of an m-plane on the surface thereof. In other words, the principal plane of the plate-like nitride semiconductor stacking structure 100 is a (10-10) plane. Planes equivalent to a (10-10) plane are a (−1010) plane, a (1-100) plane, a (−1100) plane, a (01-10) plane, and a (0-110) plane.

Since the plate-like nitride semiconductor stacking structure 100 has a principal plane of an m-plane, the plate-like nitride semiconductor stacking structure 100 has two cleavage surfaces, namely, a c-plane and an a-plane. The c-plane is a (0001) plane. The c-plane has a normal line parallel to a c-axis. The a-plane includes a (11-20) plane and a plane equivalent thereto. The a-plane has a normal line parallel to an a-axis.

Similarly to a conventional nitride semiconductor stacking structure, the plate-like nitride semiconductor stacking structure 100 may have an off-angle of more than 0 degrees and not more than 20 degrees. A plate-like nitride semiconductor stacking structure 100 which does not have an off-angle may also be used. Accordingly, the angle formed between the principal plane and an m-plane, namely, the off-angle, is not less than 0 degrees and not more than 20 degrees. Desirably, the off-angle is equal to 0 degrees, as understood from the examples which will be described later.

Figure 2:
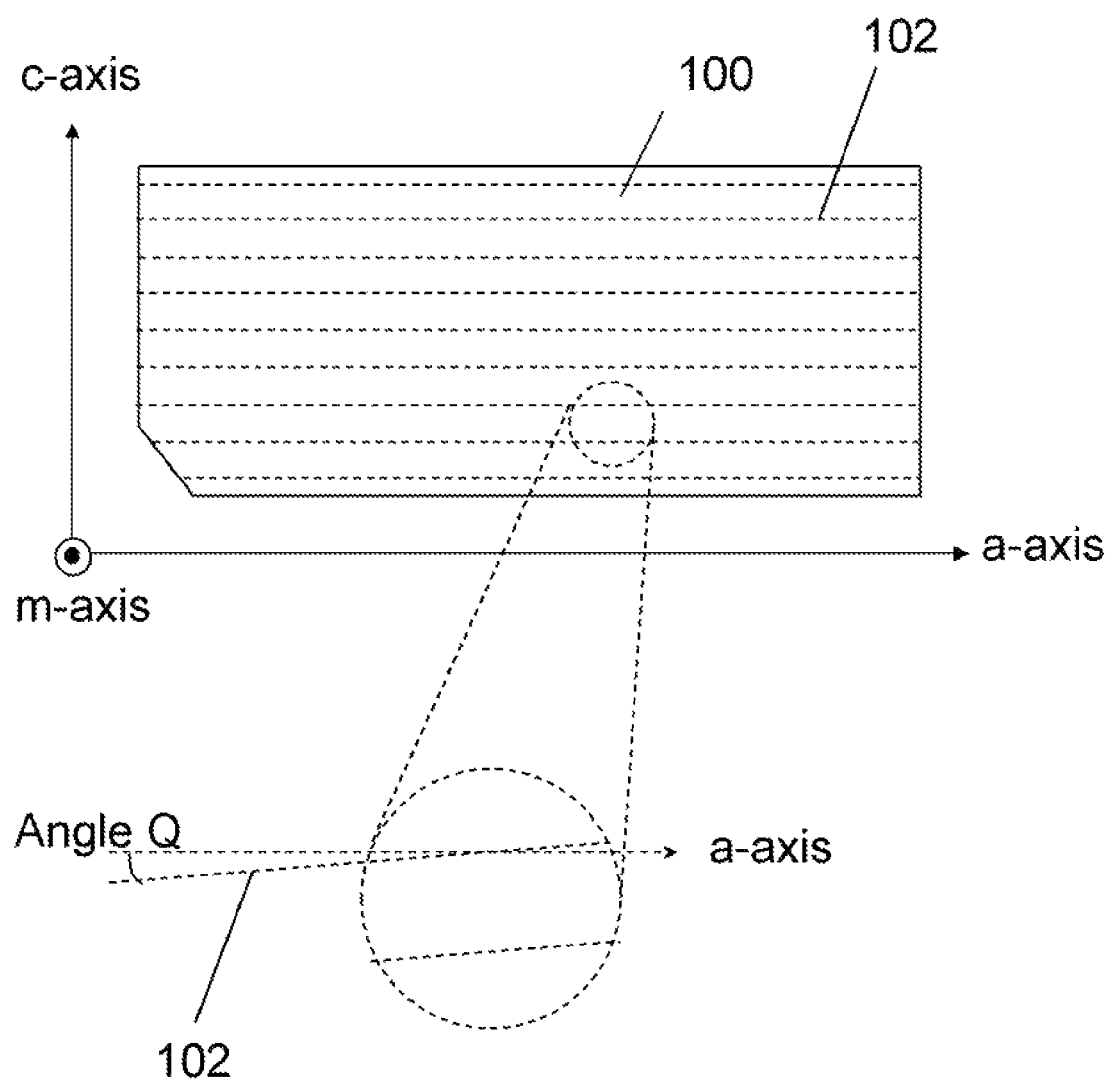
FIG. 2 shows a top view of the plate-like nitride semiconductor stacking structure 100 on which first linear grooves 102 have been formed.

As shown in FIG. 2, a plurality of first linear grooves 102 are formed on the surface of the plate-like nitride semiconductor stacking structure 100. It is desirable that the longitudinal direction of each of the first linear grooves 102 is substantially parallel to a cleavage axis selected from the group consisting of an a-axis and a c-axis. In FIG. 2, the longitudinal direction of each of the first linear grooves 102 is parallel to the a-axis. In other words, the cleavage axis is the a-axis in FIG. 2.

Figure 3:
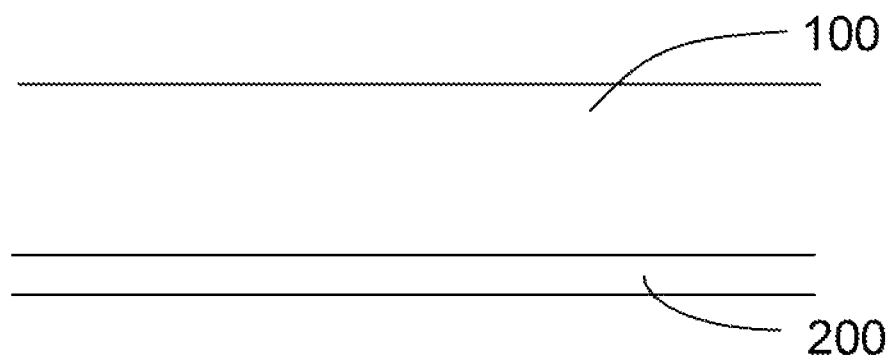
FIG. 3 shows a cross-sectional view of the plate-like nitride semiconductor stacking structure 100 which has been put on an elastic sheet 200.
Figure 4:
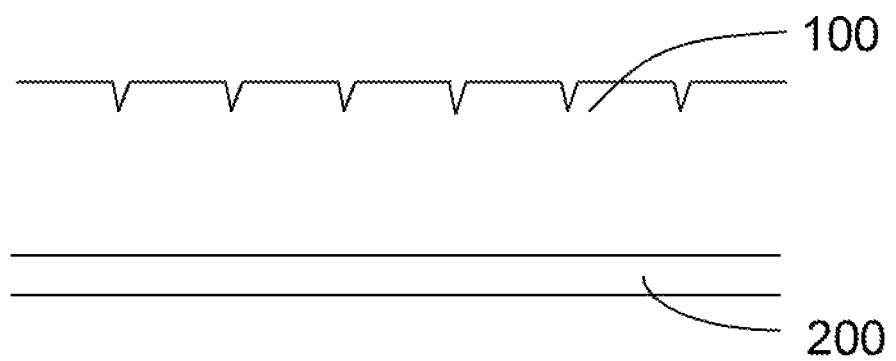
FIG. 4 shows a cross-sectional view of the plate-like nitride semiconductor stacking structure 100 having grooves on the surface thereof which has been put on the elastic sheet 200.

Specifically, first, the plate-like nitride semiconductor stacking structure 100 is put on a front surface of an elastic sheet 200, as shown in FIG. 3. Then; as shown in FIG. 2 and FIG. 4, a plurality of the first linear grooves 102 are formed on the surface of the plate-like nitride semiconductor stacking structure 100 using a scriber. Desirably, the cross-sectional view of each of the first linear grooves 102 is V-shaped.

The enlarged view shown in the lower part of FIG. 2 shows a relationship between the longitudinal direction of each of the first linear grooves 102 and the cleavage axis. It is desirable that the longitudinal direction of each of the first linear grooves 102 is parallel to the cleavage axis. However, as shown in this enlarged view, the first linear grooves 102 may be configured to be slightly inclined with respect to the cleavage axis. In other words, Angle Q may be formed between the longitudinal direction of each of the first linear grooves 102 and the cleavage axis. Desirably, Angle Q is not less than 0 degrees and not more than 5 degrees.

Figure 5:
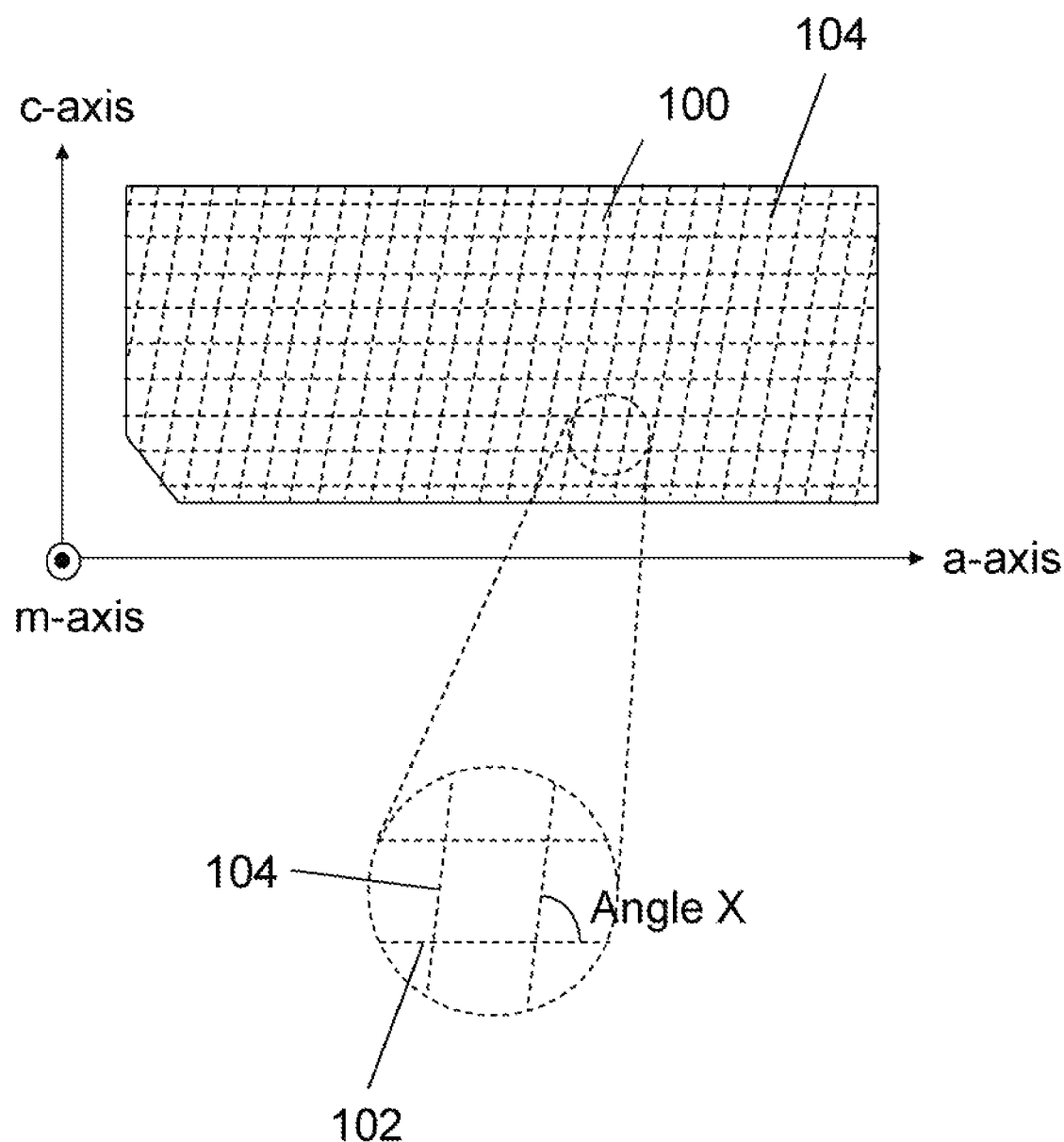
FIG. 5 shows a top view of the plate-like nitride semiconductor stacking structure 100 on which first linear grooves 102 and second linear grooves 104 have been formed.

Then, similarly to the case of the first linear grooves 102, second linear grooves 104 are formed on the surface of the plate-like nitride semiconductor stacking structure 100, as shown in FIG. 5. The enlarged view shown in the lower part of FIG. 5 shows a relationship between the first linear grooves 102 and the second linear grooves 104. As shown in this enlarged view, Angle X is formed between the first linear groove 102 and the second linear groove 104. Angle X is not less than 75 degrees and not more than 105 degrees. The fault which arises in case where Angle X is less than 75 degrees or more than 105 degrees will be described in detail in the description of the step (c).

Figure 6:
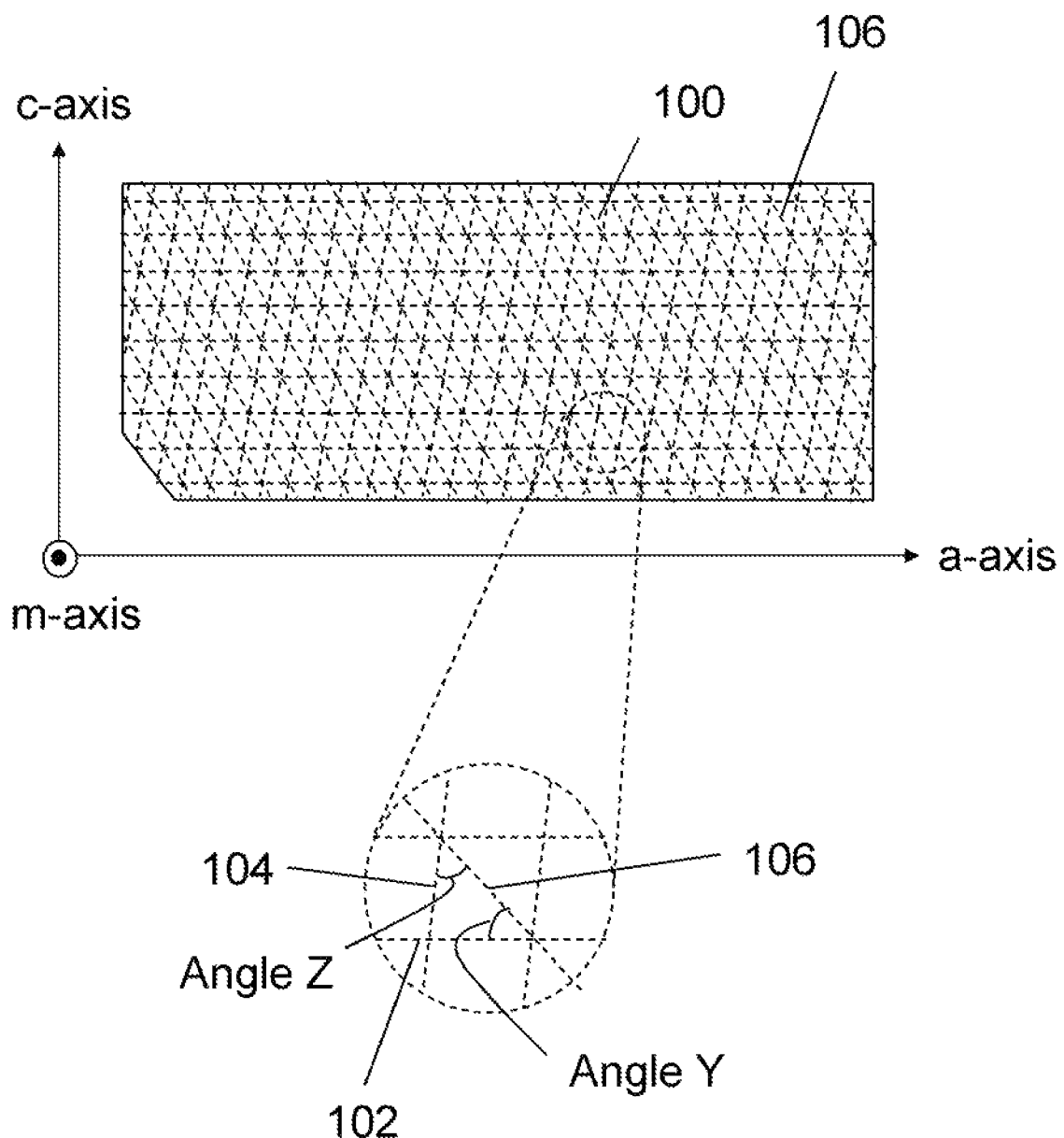
FIG. 6 shows a top view of the plate-like nitride semiconductor stacking structure 100 on which the first linear grooves 102, the second linear grooves 104, and third linear grooves 106 have been formed.

Finally, similarly to the case of the first linear grooves 102, third linear grooves 106 are formed on the surface of the plate-like nitride semiconductor stacking structure 100, as shown in FIG. 6. The enlarged view shown in the lower part of FIG. 6 shows a relationship among the first linear grooves 102, the second linear grooves 104, and the third linear grooves 106. As shown in this enlarged view, Angle Y is formed between the first linear groove 102 and the third linear groove 106. Angle Y is not less than 20 degrees. Angle Z is formed between the second linear groove 104 and the third linear groove 106, Angle Z is also not less than 20 degrees.

As is clear from FIG. 6, triangles are composed of the first linear grooves 102, the second linear grooves 104, and the third linear grooves 106 in the top view. In this way, prepared is the plate-like nitride semiconductor stacking structure 100 having the first linear grooves 102, the second linear grooves 104, and the third linear grooves 106 which satisfy the following formulae (I) to (III):

$$75 \text{ degrees} \leq \text{Angle } X \leq 105 \text{ degrees} \quad \text{(I)}$$

$$20 \text{ degrees} \leq \text{Angle } Y \quad \text{(II)}$$

$$20 \text{ degrees} \leq \text{Angle } Z \quad \text{(III)}$$

where

Angle X represents an angle formed between the cleavage axis and the longitudinal direction of the second linear groove 104, Angle Y represents an angle formed between the longitudinal direction of the first linear groove 102 and the longitudinal direction of the third linear groove 106, and Angle Z represents an angle formed between the longitudinal direction of the second linear groove 104 and the longitudinal direction of the third linear groove 106.

(Step (b))

Figure 7:
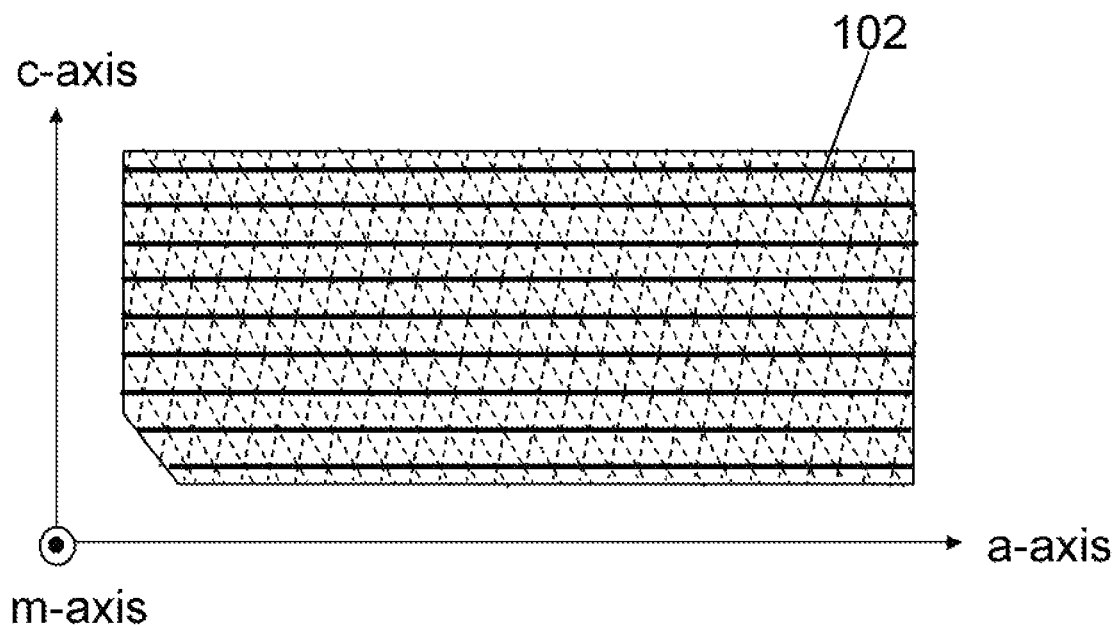
FIG. 7 shows a top view of the nitride semiconductor stacking structure which has been broken along the first linear grooves 102 in the step (b).

Then, the step (b) will be described. In the step (b), as shown in FIG. 7, the plate-like nitride semiconductor stacking structure 100 is broken along the first linear grooves 102 to form a plurality of belt-like nitride semiconductor stacking structures 110. The step (b) is a first breaking step.

Figure 8:
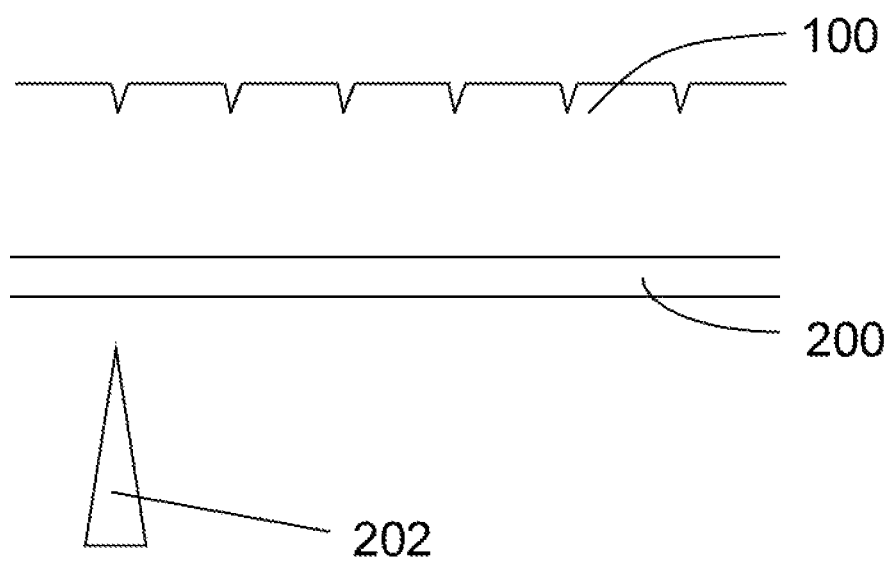
FIG. 8 shows a cross-sectional view of the plate-like nitride semiconductor stacking structure 100 to be broken using a blade 202 in the steps (b)-(d).
Figure 9:
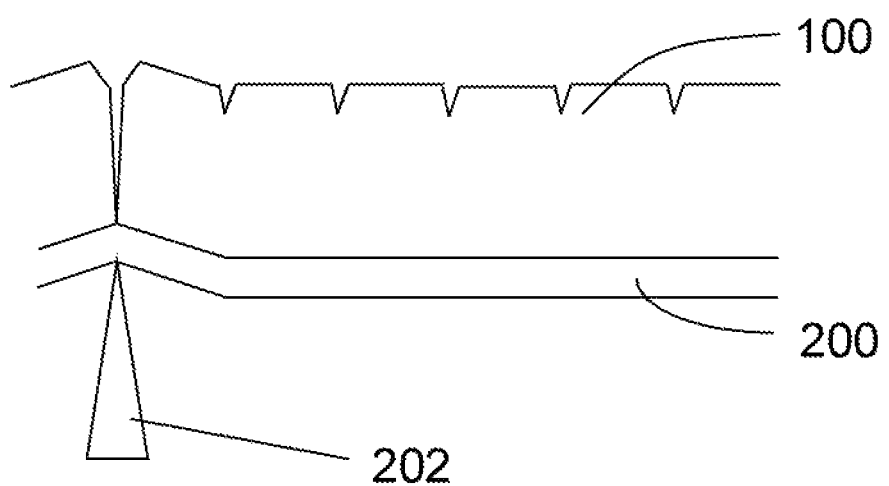
FIG. 9 shows a cross-sectional view of the plate-like nitride semiconductor stacking structure 100 which has been broken using the blade 202 in the steps (b)-(d).

Specifically, as shown in FIG. 8 and FIG. 9, a blade 202 is driven upwardly from the back surface of the elastic sheet 200 toward the nitride semiconductor stacking structure 100 just beneath the first linear groove 102 so as to push the elastic sheet 200 upwardly using the blade 202. As a result, the elastic sheet 200 is deformed as shown in FIG. 9. The nitride semiconductor stacking structure 100 is broken by driving the blade 202 in such a way to give the belt-like nitride semiconductor stacking structure 110 shown in FIG. 10. In this way, a first side surface 112 appears.

The driving of the blade 202 may be repeated to form a plurality of the belt-like nitride semiconductor stacking structures 110. In more detail, at least one of the blade 202 and the elastic sheet 200 is moved along the cleavage axis so as to set the blade 202 to be just below another first linear groove 102. Subsequently, the blade 202 is driven to break the nitride semiconductor stacking structure 100. This is repeated.

Figure 10:
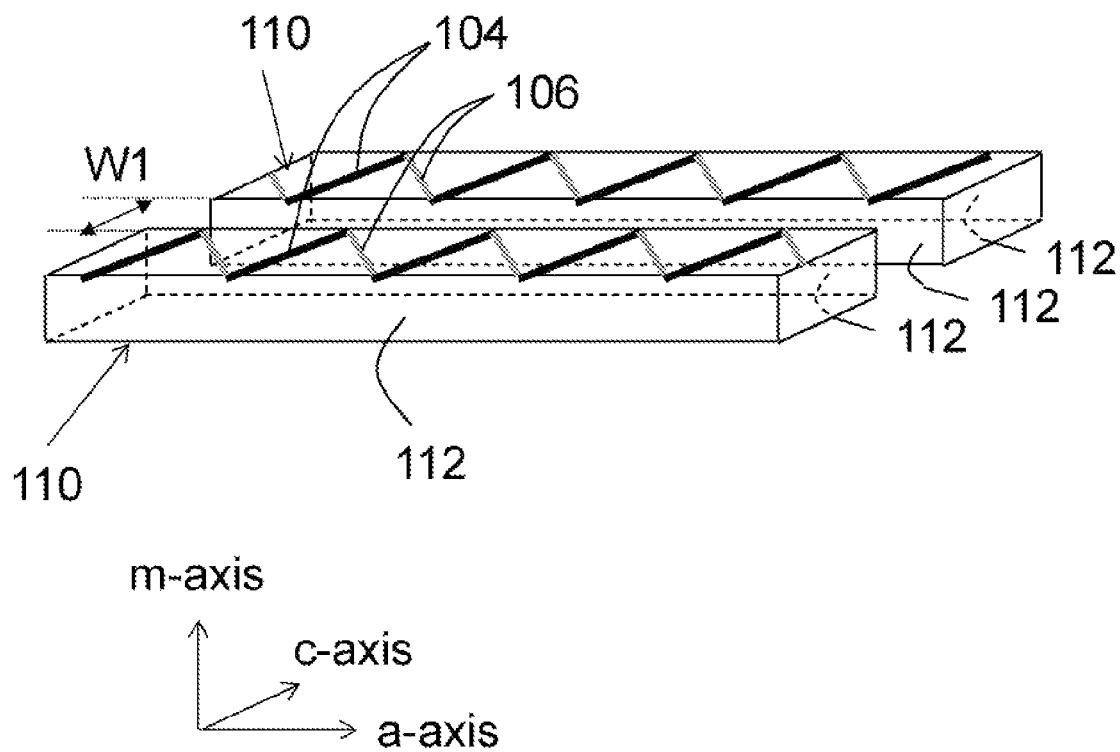
FIG. 10 is an oblique projection drawing of a belt-like nitride semiconductor stacking structure 110 obtained in the step (b).

As shown in FIG. 10, the belt-like nitride semiconductor stacking structure 110 has a pair of first side surfaces 112 on the lateral sides thereof. Needless to say, the first side surface 112 is parallel to the longitudinal direction of the first linear groove 102. Since the nitride semiconductor stacking structure 100 is broken along the first linear grooves 102, Angle Q is formed in the top view between the first side surface 112 and one cleavage surface selected from the group consisting of an a-plane and a c-plane. As described in the step (a), since it is desirable that Angle Q is equal to 0 degrees, it is desirable that the first side surface 112 is an a-plane or a c-plane. In FIG. 10, the first side surface 112 is a c-plane.

In order to promote the understanding, the two adjacent belt-like nitride semiconductor stacking structures 110 are apart from each other in FIG. 10. However, actually, the width W1 between the two adjacent belt-like nitride semiconductor stacking structures 110 is substantially 0 micrometers, unless the elastic sheet 200 is stretched. Similarly, in FIG. 12 and FIG. 14, the width between adjacent nitride semiconductor stacking structures is substantially 0 micrometers.

(Step (c))

Figure 11:
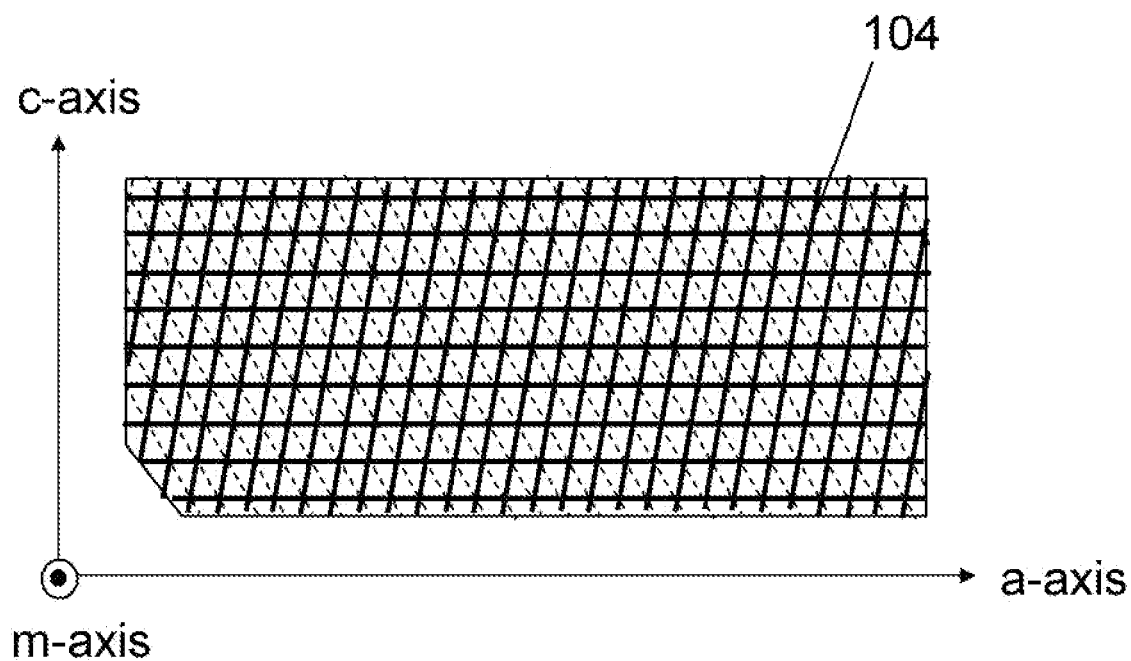
FIG. 11 shows a top view of the nitride semiconductor stacking structure broken along the second linear grooves 104 in the step (c).

Then, the step (c) will be described. As shown in FIG. 11, in the step (c), the belt-like nitride semiconductor stacking structure 110 formed in the step (b) is broken along the second linear grooves 104 to form a quadratic prismatic nitride semiconductor stacking structure 120. In the top view, the quadratic prismatic nitride semiconductor stacking structure 120 has a shape of a parallelogram. The step (c) is a second breaking step.

Similarly to the case of the step (b), the blade 202 is driven toward the belt-like nitride semiconductor stacking structure 110 to break the belt-like nitride semiconductor stacking structure 110. In this way, a second side surface 122 appears.

Figure 12:
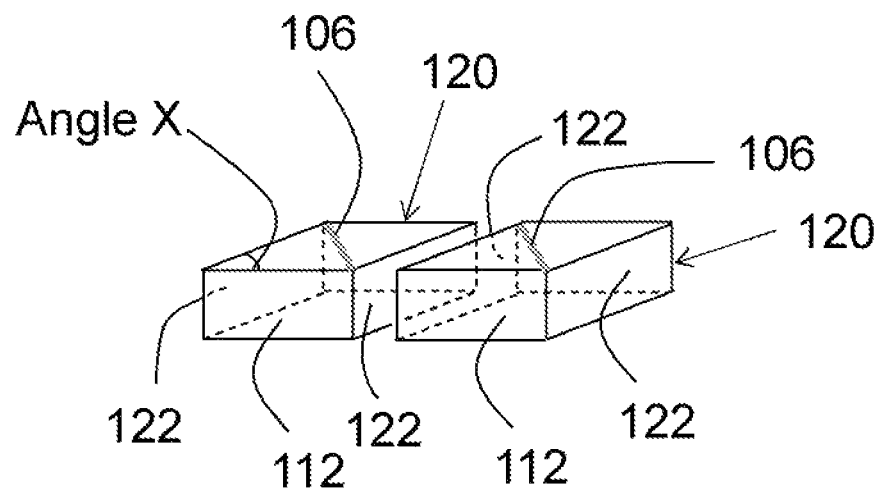
FIG. 12 shows an oblique projection drawing of a quadratic prismatic nitride semiconductor stacking structure 120 obtained in the step (c).

As shown in FIG. 12, the lateral sides of the quadratic prismatic nitride semiconductor stacking structure 120 are composed of the two first side surfaces 112 and the two second side surfaces 122. The second side surface 122 is parallel to the longitudinal direction of the second linear groove 104. Desirably, the second side surface 122 is perpendicular to the principal plane of the quadratic prismatic nitride semiconductor stacking structure 120.

As shown in FIG. 12, Angle X is formed between the first side surface 112 and the second side surface 122 in the top view.

As describe above, Angle X is not less than 75 degrees and not more than 105 degrees. In the present specification, a second side surface 122 inclined at an angle of θ degrees with respect to the first side surface 112 is equivalent to a second side surface 122 inclined at an angle of (180−θ) degrees with respect to the first side surface 112 in the top view. For example, three second side surfaces 122 inclined at an angle of 75 degrees, 60 degrees, and 45 degrees with respect to the first side surface 112 are equivalent to three second side surfaces 122 inclined at an angle of 105 degrees, 120 degrees, and 135 degrees with respect to the first side surface 112, respectively.

Angle X of less than 75 degrees or more than 105 degrees increases a possibility that not only the second side surface 122 but also a first error side surface 124 and a second error side surface 126 are formed on the lateral side of the nitride semiconductor stacking structure 120 obtained in the step (c), as demonstrated in the comparative examples 1-2, which will be described later. In other words, in case where Angle X is less than 75 degrees or more than 105 degrees, the first error side surface 124 and the second error side surface 126 tend to be formed easily. See FIG. 19 and FIG. 20. In case where the first error side surface 124 and the second error side surface 128 are formed, the nitride semiconductor light-emitting diode obtained in the step (d) is not triangular prismatic. Accordingly, Angle X of less than 75 degrees or more than 105 degrees decreases fabrication efficiency of the triangular prismatic nitride semiconductor light-emitting diode.

Desirably, Angle X is not less than 80 degrees and not more than 100 degrees. More desirably, Angle X is 90 degrees. Still more desirably, the first side surface 112 is a c-plane and Angle X is 90 degrees. In other words, it is still more desirable that the first side surface 112 and the second side surface 122 are a c-plane and an a-plane, respectively. Instead of this, it is also desirable that the first side surface 112 and the second side surface 122 are an a-plane and a c-plane, respectively. As such it is still more desirable that the quadratic prismatic nitride semiconductor stacking structure 120 has a shape of a rectangle (including a square) in the top view.

(Step (d))

Figure 13:
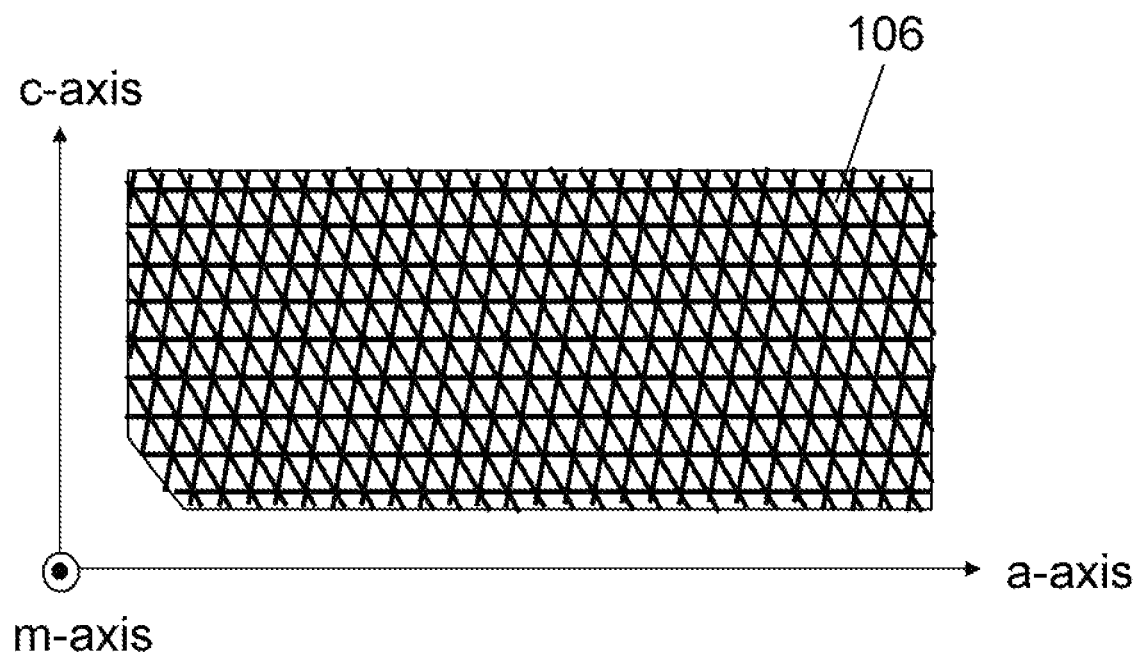
FIG. 13 shows a top view of the nitride semiconductor stacking structure broken along the third linear grooves 106 in the step (d).

Finally, the step (d) will be described. As shown in FIG. 13, in the step (d), the quadratic prismatic nitride semiconductor stacking structure 120 formed in the step (c) is broken along the third linear grooves 106 to form a triangular prismatic nitride semiconductor light-emitting diode 130 shown in FIG. 14. The step (d) is a third breaking step.

Similarly to the case of the step (b), the blade 202 is driven toward the quadratic prismatic nitride semiconductor stacking structure 120 to break the quadratic prismatic nitride semiconductor stacking structure 120. In this way, a third side surface 132 appears.

Figure 14:
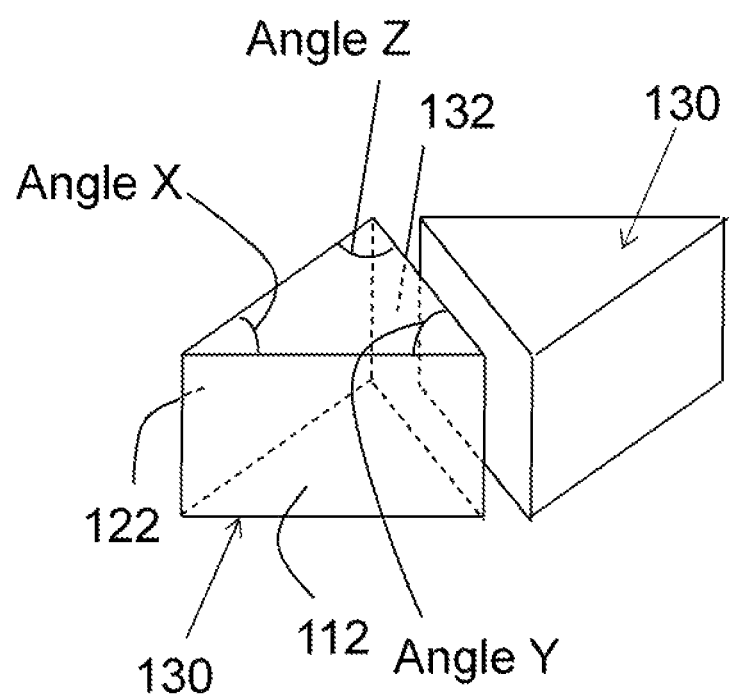
FIG. 14 shows an oblique projection drawing of the triangular prismatic nitride semiconductor light-emitting diode obtained in the step (d).

As shown in FIG. 14, the lateral sides of the triangular prismatic nitride semiconductor light-emitting diode 130 are composed of the first side surface 112, the second side surface 122, and the third side surface 132. The third side surface 132 is parallel to the longitudinal direction of the third linear groove 106. It is desirable that the third side surface 132 is perpendicular to the principal plane of the triangular prismatic nitride semiconductor light-emitting diode 130.

As shown in FIG. 14, Angle Y is formed between the first side surface 112 and the third side surface 132 in the top view. Angle Z is formed between the second side surface 122 and the third side surface 132.

Angle Y is not less than 20 degrees. Generally, it is difficult to form a triangular prismatic nitride semiconductor light-emitting diode 130 having Angle of less than 20 degrees. The reason is that a corner part of Angle Y may be erroneously removed due to the shock that has occurred by driving the blade 202, in case where Angle Y is less than 20 degrees. For a similar reason, Angle Z is also not less than 20 degrees.

Unlike in the case of the step (c), Angle Y can be less than 75 degrees in the step (d), as long as Angle Y is not less than 20 degrees. In other words, even if Angle Y is less than 75 degrees, error side surfaces are not formed easily in the step (d), as long as Angle Y is not less than 20 degrees.

In the step (c), namely, the second breaking step, in case where the second side surface 122 is formed inclined at Angle X of not less than 20 degrees and less than 75 degrees with respect to the cleavage axis in the top view, the error side surface may appear simultaneously. On the other hand, in the step (d), namely, the third breaking step, even if the third side surface 132 inclined at Angle Y of not less than 20 degrees and less than 75 degrees with respect to the cleavage axis in the top view, the error side surface does not appear. Note that Angle Y is 60 degrees in the examples 1-3, which will be described later.

In this way, the triangular prismatic nitride semiconductor light-emitting diode 130 shown in FIG. 14 is obtained.

As is clear from the above-mentioned description, the lateral sides of the triangular prismatic nitride semiconductor light-emitting diode 130 are composed of the first side surface 112, the second side surface 122, and the third side surface 132. The triangular prismatic nitride semiconductor light-emitting diode 130 satisfies the following formulae (I) to (III):

$$75 \text{ degrees} \leq \text{Angle } X \leq 105 \text{ degrees} \quad \text{(I)}$$

$$20 \text{ degrees} \leq \text{Angle } Y \quad \text{(II)}$$

$$20 \text{ degrees} \leq \text{Angle } Z \quad \text{(III)}$$

where

Angle X represents an angle formed between the first side surface 112 and the second side surface 122 in the top view, Angle Y represents an angle formed between the first side surface 112 and the third side surface 132 in the top view, and Angle Z represents an angle formed between the second side surface 122 and the third side surface 132 in the top view.

EXAMPLES

The present invention will be described below in more detail with reference to the following examples.

Example 1

An m-plane gallium nitride substrate was prepared. The angle formed between the principal plane of the m-plane gallium nitride substrate and an m-plane, namely, the off-angle, was 0 degrees. The m-plane gallium nitride substrate had a thickness of about 300 micrometers. The length of one side parallel to a c-axis of the m-plane gallium nitride substrate was approximately 8 millimeters. The length of one side parallel to an a-axis of the m-plane gallium nitride substrate was approximately 10 millimeters.

(Step (a))

First, in the step (a), a nitride semiconductor stacking structure was epitaxially grown on the m-plane gallium nitride substrate in accordance with the method disclosed in US Pre-Grant Patent Application Publication No. 2013/0126902A. The nitride semiconductor stacking structure was composed of a p-type nitride semiconductor layer, an active layer, and an n-type nitride semiconductor layer. Furthermore, a p-side electrode and an n-side electrode, both of which are not shown, were also formed. In this way, a plate-like nitride semiconductor stacking structure 100 shown in FIG. 1 was obtained. US Pre-Grant Patent Application Publication No. 2013/0126902A is incorporated herein by reference. The nitride semiconductor stacking structure had a thickness of 5 micrometers.

As shown in FIG. 3, the plate-like nitride semiconductor stacking structure 100 was put on a front surface of an elastic sheet 200. The front surface was adhesive.

Then, as shown in FIG. 2, a plurality of first linear grooves 102 were formed on a front surface of the plate-like nitride semiconductor stacking structure 100 using a laser scriber (available from Disco Corporation, Trade name: DAL7020). The distance between the two adjacent first linear grooves 102 was approximately 1,000 micrometers. The number of the first linear grooves 102 was eight. Each of the first linear grooves 102 was parallel to an a-axis. In other words, Angle Q was 0 degrees. The cross-sectional view of each of the first linear grooves 102 was V-shaped. Each of the first linear grooves 102 had a depth of approximately 30 micrometers.

As shown in FIG. 5, a plurality of second linear grooves 104 were formed on the front surface of the plate-like nitride semiconductor stacking structure 100 using the laser scriber. The distance between the two adjacent second linear grooves 104 was approximately 742 micrometers. The number of the second linear grooves 104 was thirteen. Angle X of 80 degrees was formed between the longitudinal direction of each of the second linear grooves 104 and an a-axis. Similarly to the first linear grooves 102, each of the second linear grooves 104 was also V-shaped and had a depth of approximately 30 micrometers.

As shown in FIG. 6, a plurality of third linear grooves 106 were formed on the front surface of the plate-like nitride semiconductor stacking structure 100 using the laser scriber. The distance between the two adjacent third linear grooves 106 was approximately 653 micrometers. The number of the third linear grooves 106 was sixteen. Angle Y of 60 degrees was formed between the longitudinal direction of each of the third linear grooves 106 and an a-axis. Angle Z was 40 degrees. Similarly to the first linear grooves 102, each of the third linear grooves 106 was also V-shaped and had a depth of approximately 30 micrometers. In this way, a plurality of the first linear grooves 102, a plurality of the second linear grooves 104, and a plurality of the third linear grooves 106 were formed on the principal plane of the plate-like nitride semiconductor stacking structure 100.

As shown in FIG. 6, a plurality of triangles were composed of the plurality of the first linear grooves 102, the plurality of the second linear grooves 104, and the plurality of the third linear grooves 106 in the top view of the plate-like nitride semiconductor stacking structure 100. After the step (a) was completed, grooves were formed on the front surface of the plate-like nitride semiconductor stacking structure 100, as shown in FIG. 4.

(Step (b))

In the step (b), as shown in FIG. 7, FIG. 8 and FIG. 9, the plate-like nitride semiconductor stacking structure 100 was broken along the first linear grooves 102 using a breaking device (available from OPTO.SYSTEM Co Ltd., Trade name: WBF-6010). In more detail, as shown in FIG. 8 and FIG. 9, a blade 202 was driven upwardly from the back surface of the elastic sheet 200 toward the plate-like nitride semiconductor stacking structure 100 just beneath the first linear groove 102 such that the blade 202 pushed up the elastic sheet 200 upwardly. The blade 202 was driven to break the plate-like nitride semiconductor stacking structure 100.

Then, just beneath the adjacent first linear groove 102, the blade 202 was driven similarly. The driving of the blade 202 was repeated eight times. The plate-like nitride semiconductor stacking structure 100 was broken along the first linear grooves 102 in such a way to give a plurality of belt-like nitride semiconductor stacking structures 110 shown in FIG. 10.

The blade 202 had a blunt edge. For this reason, even when the blade 202 was driven to the elastic sheet 200, the elastic sheet 200 was not cut, but just stretched upwardly. After the blade 202 was moved downwardly so as to be apart from the elastic sheet 200, the elastic sheet 200 returned to the original state, namely, a flat state.

As shown in FIG. 10, each of the belt-like nitride semiconductor stacking structures 110 had a pair of first side surfaces 112 on the lateral sides thereof along the longitudinal direction thereof. Each of the first side surfaces 112 was parallel to the longitudinal direction of the first linear groove 102. Each of the first side surfaces 112 was perpendicular to the principal plane of the belt-like nitride semiconductor stacking structure 110.

(Step (c))

In the step (c), as shown in FIG. 8, FIG. 9, and FIG. 11, the belt-like nitride semiconductor stacking structure 110 was broken along second linear grooves 104. Similarly to the case of the step (b), driving of the blade 202 toward the belt-like nitride semiconductor stacking structure 110 was repeated thirteen times. The belt-like nitride semiconductor stacking structure 110 was broken along the second linear grooves 104 to give a plurality of quadratic prismatic nitride semiconductor stacking structures 120 shown in FIG. 12.

As shown in FIG. 12, the lateral sides of each of the quadratic prismatic nitride semiconductor stacking structures 120 were composed of not only the two first side surfaces 112 but also two second side surfaces 122. Each of the second side surfaces 122 was parallel to the longitudinal direction of the second linear groove 104. Each of the second side surfaces 122 was perpendicular to the principal plane of the quadratic prismatic nitride semiconductor stacking structure 120.

(Step (d))

In the step (d), as shown in FIG. 8, FIG. 9, and FIG. 13, the quadratic prismatic nitride semiconductor stacking structure 120 was broken along the third linear grooves 106. Similarly to the case of the step (b), driving of the blade 202 toward the quadratic prismatic nitride semiconductor stacking structure 120 was repeated sixteen times. The quadratic prismatic nitride semiconductor stacking structure 120 was broken along the third linear grooves 106 to give a plurality of triangular prismatic nitride semiconductor light-emitting diodes 130 shown in FIG. 14.

As shown in FIG. 14, the lateral sides of each of the triangular prismatic nitride semiconductor light-emitting diodes 130 were composed of one first side surface 112, one second side surface 122, and one third side surface 132. The third side surface 132 was parallel to the longitudinal direction of the third linear groove 106. The third side surface 132 was perpendicular to the principal plane of the triangular prismatic nitride semiconductor light-emitting diode 130.

In this way, the triangular prismatic nitride semiconductor light-emitting diodes 130 were provided. In the top view, the triangular prismatic nitride semiconductor light-emitting diode 130 had a shape of a triangle where Angle X, Angle Y, and Angle Z were 80 degrees, 60 degrees, and 40 degrees, respectively. The lateral sides of the nitride semiconductor light-emitting diode 130 were composed of the first side surface 112, the second side surface 122, and the third side surface 132.

Figure 15:
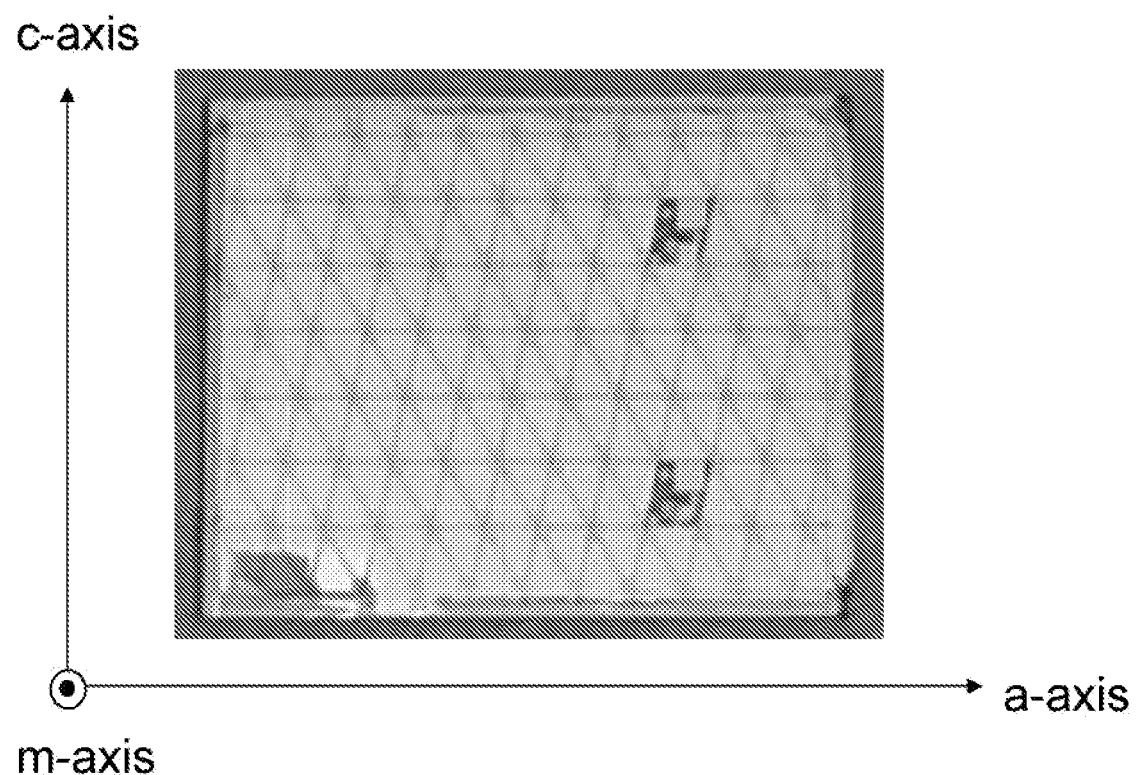
FIG. 15 is a top-view photograph of the plate-like nitride semiconductor stacking structure broken along the first linear grooves 102, the second linear grooves 104, and the third linear grooves 106 in the example 1.

FIG. 15 is a top-view photograph of the plate-like nitride semiconductor stacking structure 100 broken along the first linear grooves 102, the second linear grooves 104, and the third linear grooves 106 in this way. In this state, a plurality of the triangular prismatic nitride semiconductor light-emitting diodes 130 were closed up in such a manner that each first side surface, each second side surface, and each third side surface were in contact with the opposite first side surface, the opposite second side surface, and the opposite third side surface, respectively.

Then, the elastic sheet 200 was stretched in a c-axis direction and an a-axis direction.

Figure 16:
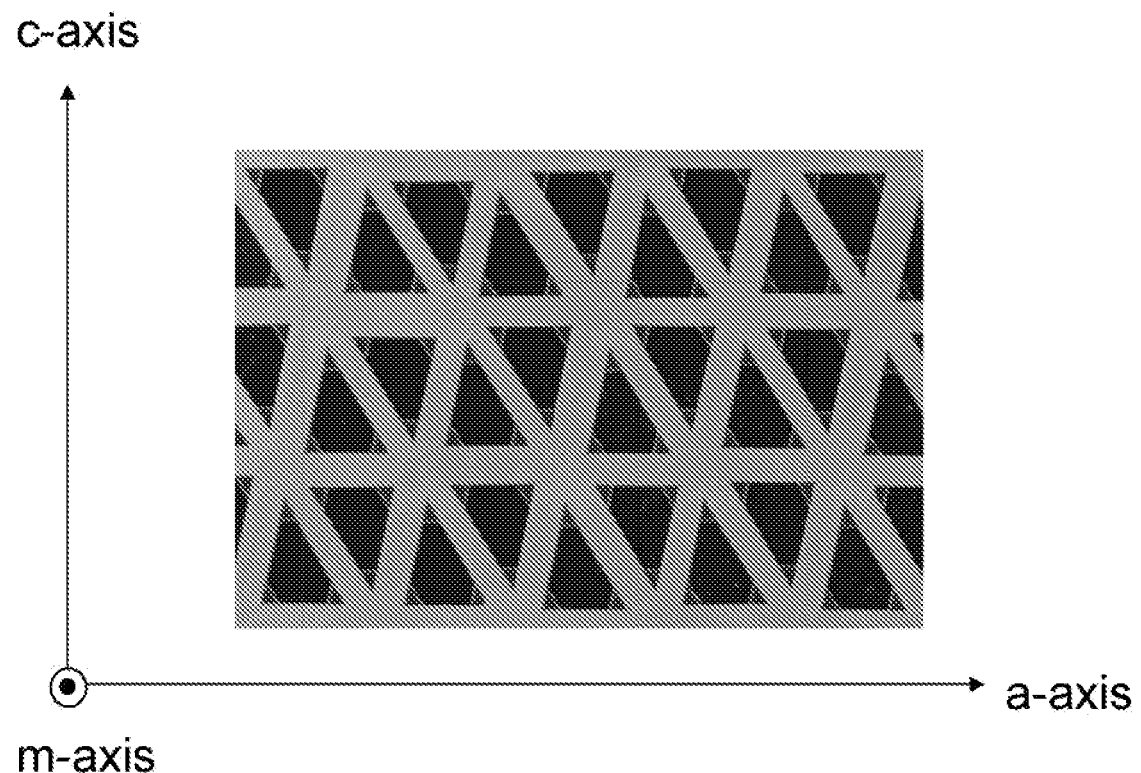
FIG. 16 is a top-view photograph of the plate-like nitride semiconductor stacking structure after the elastic sheet 200 has been stretched in the example 1.

FIG. 16 shows a top-view photograph of the plurality of the triangular prismatic nitride semiconductor light-emitting diodes 130 thus stretched. In this state, each first side surface, each second side surface, and each third side surface were apart from the opposite first side surface, the opposite second side surface, and the opposite third side surface, respectively.

Figure 17:
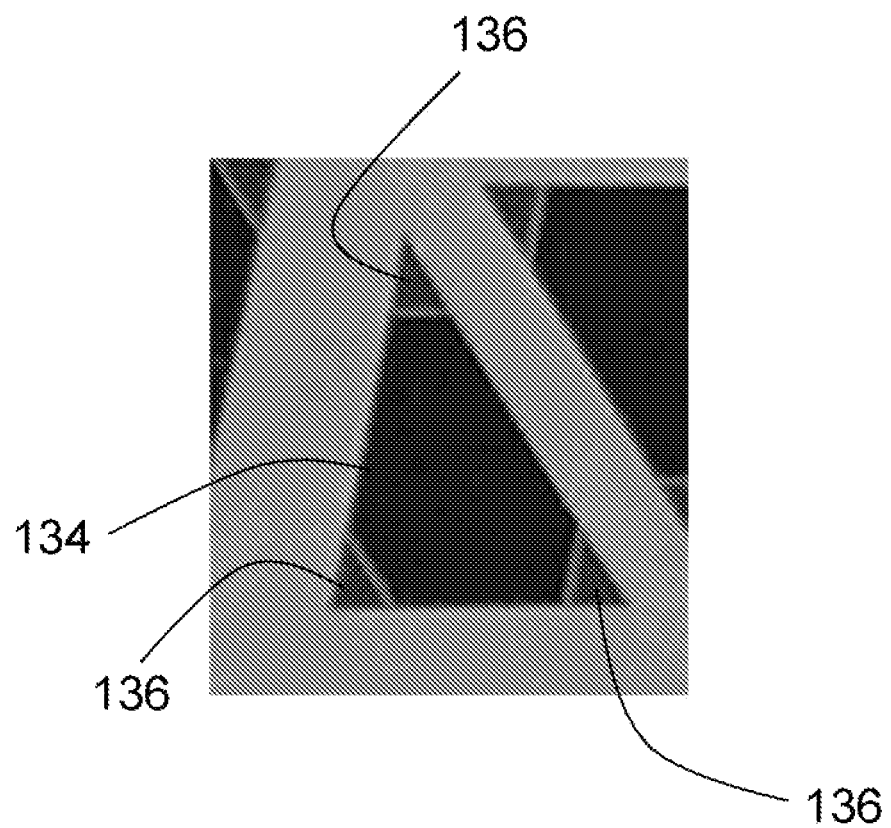
FIG. 17 is a partially enlarged photograph of FIG. 16 that is a top-view photograph of the triangular prismatic nitride semiconductor light-emitting diode according to the example 1.

FIG. 17 shows an enlarged photograph of the triangular prismatic nitride semiconductor light-emitting diode 130 shown in FIG. 16. As is clear from FIG. 16 and FIG. 17, all the nitride semiconductor light-emitting diodes 130 were triangular prismatic. As shown in FIG. 17, each triangular prismatic nitride semiconductor light-emitting diode 130 had three n-side electrodes 136 near the three corners thereof in the top view. A p-side electrode 134 was formed on the front surface of the triangular prismatic nitride semiconductor light-emitting diode 130 except for portions of these three n-side electrodes 136.

Figure 18A:
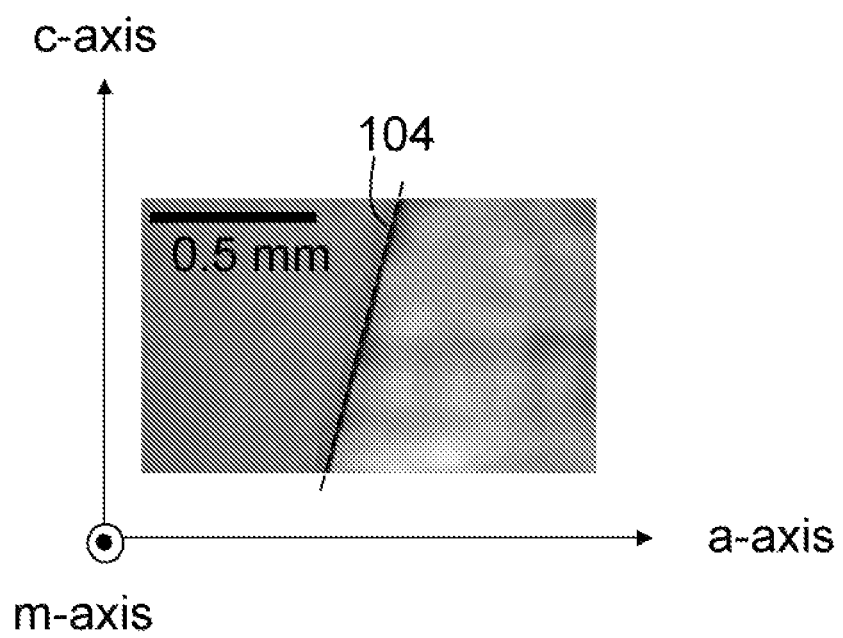
FIG. 18A is an enlarged top-view photograph in the example 1 after the belt-like nitride semiconductor stacking structure was broken along the second linear grooves 104 in the step (c) of the example 1.

FIG. 18A is an enlarged top-view photograph which shows the belt-like nitride semiconductor stacking structure 110 broken along the second linear groove 104 according to the example 1. As is clear from FIG. 18A, only the second side surface 122 was formed on the lateral side of the obtained nitride semiconductor stacking structure, since the belt-like nitride semiconductor stacking structure 110 was appropriately broken along the second linear groove 104.

Example 2

A triangular prismatic nitride semiconductor light-emitting diode 130 similar to that of the example 1 was fabricated, expect that Angle X was 90 degrees. In other words, the longitudinal direction of the second linear groove 104 was parallel to a c-axis in the example 2.

Figure 18B:
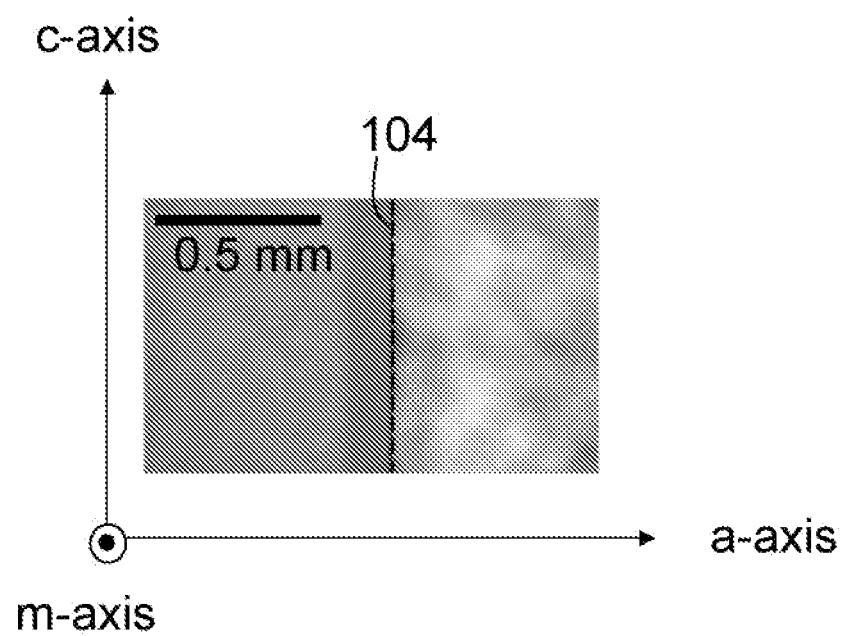
FIG. 18B is an enlarged top-view photograph in the example 2 after the belt-like nitride semiconductor stacking structure was broken along the second linear grooves 104 in the step (c) of the example 2.

FIG. 18B is an enlarged top-view photograph which shows the belt-like nitride semiconductor stacking structure 110 broken along the second linear groove 104 according to the example 2. Similarly to the case of FIG. 18A, only the second side surface 122 was formed on the lateral side of the obtained nitride semiconductor stacking structure.

Example 3

A triangular prismatic nitride semiconductor light-emitting diode 130 similar to that of the example 1 was fabricated, expect that Angle X was 75 degrees.

Comparative Example 1

A triangular prismatic nitride semiconductor light-emitting diode 130 similar to that of the example 1 was fabricated, expect that Angle X was 60 degrees.

Figure 19:
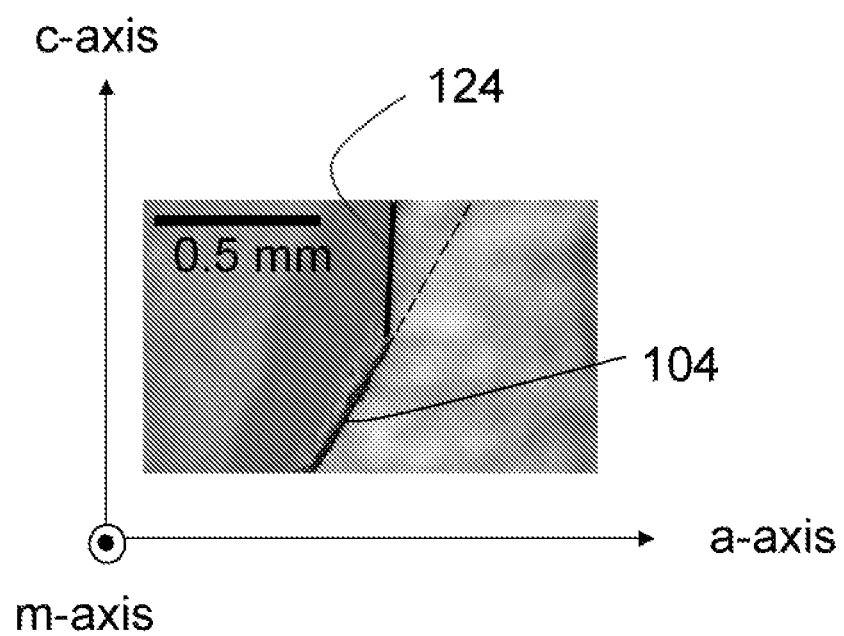
FIG. 19 is an enlarged top-view photograph in the comparative example 1 after the belt-like nitride semiconductor stacking structure was broken along the second linear grooves 104 in the step (c) of the comparative example 1.

FIG. 19 shows an enlarged top-view photograph of the belt-like nitride semiconductor stacking structure 110 broken along the second linear groove 104 in the comparative example 1. As is clear from FIG. 19, some of the obtained nitride semiconductor stacking structures had not only the second side surface 122 but also the first error side surface 124 on the lateral side thereof, since the belt-like nitride semiconductor stacking structure 110 was broken wrongly. Simultaneously formed was the second error side surface 126, which is not shown in FIG. 19.

Figure 20:
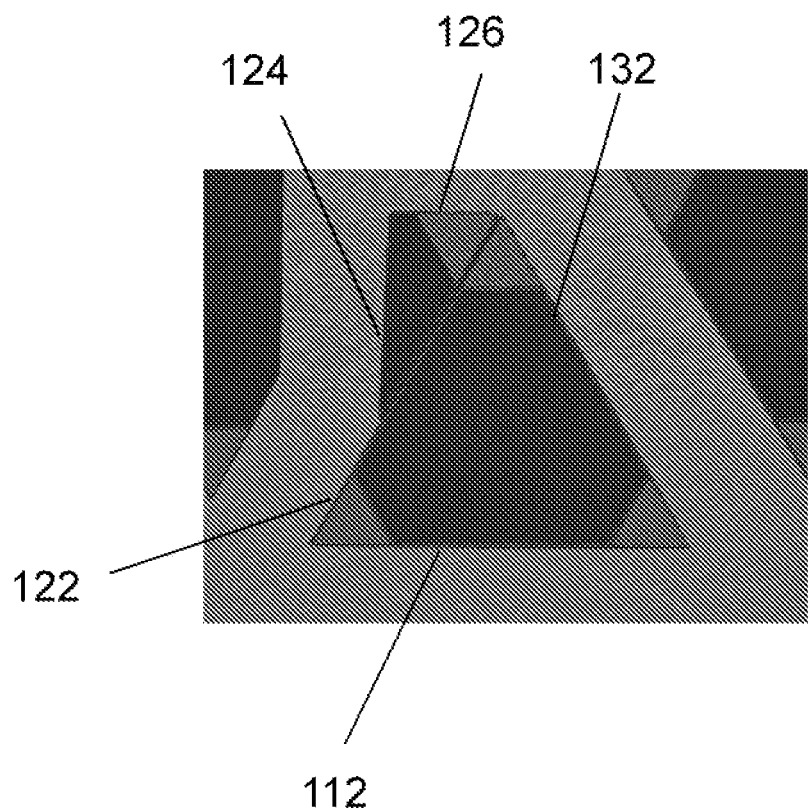
FIG. 20 is a top-view photograph of the nitride semiconductor light-emitting diode according to the comparative example 1.
Figure 21:
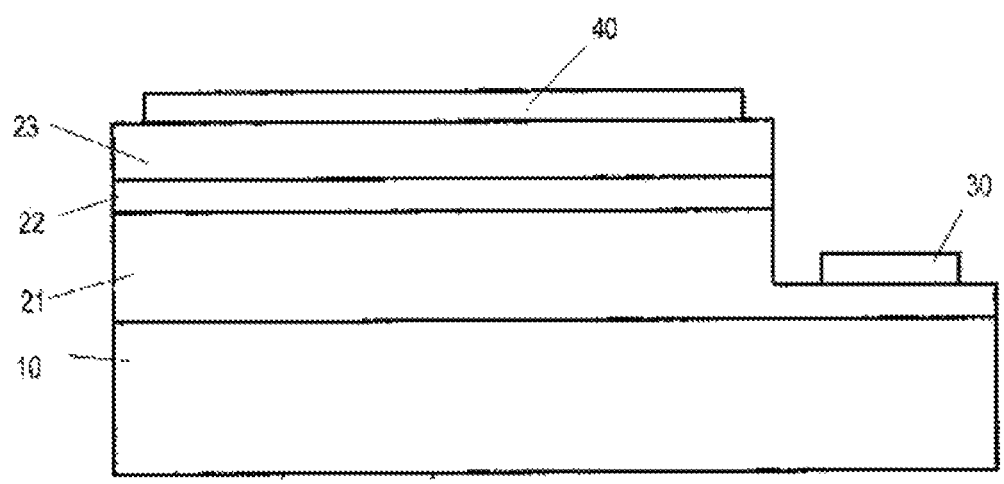
FIG. 21 shows an m-plane nitride semiconductor light-emitting diode disclosed in US Pre-Grant Patent Application Publication No. 2013/0126902A.
Figure 22:
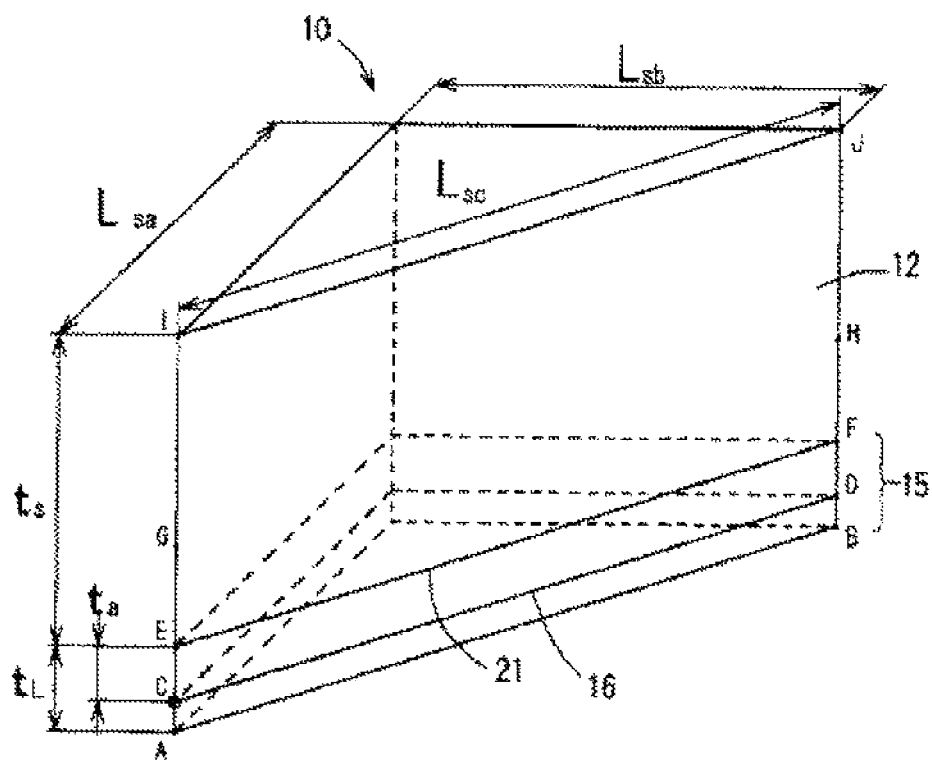
FIG. 22 shows a duplicate of FIG. 3G included in Japanese Patent Application laid-open Publication No. 2012-023249A.
Figure 23:
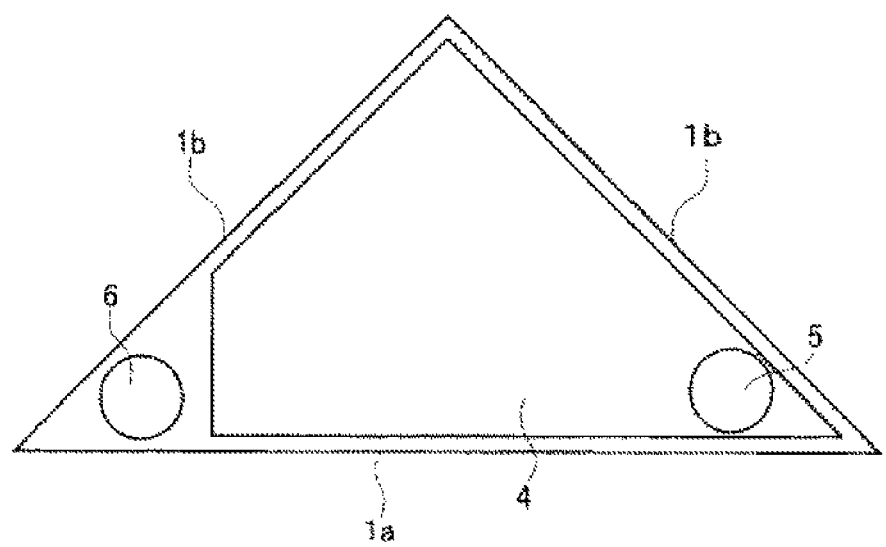
FIG. 23 shows a duplicate of FIG. 20 included in Japanese Patent Application laid-open Publication No. 2009-071174A.
Figure 24:
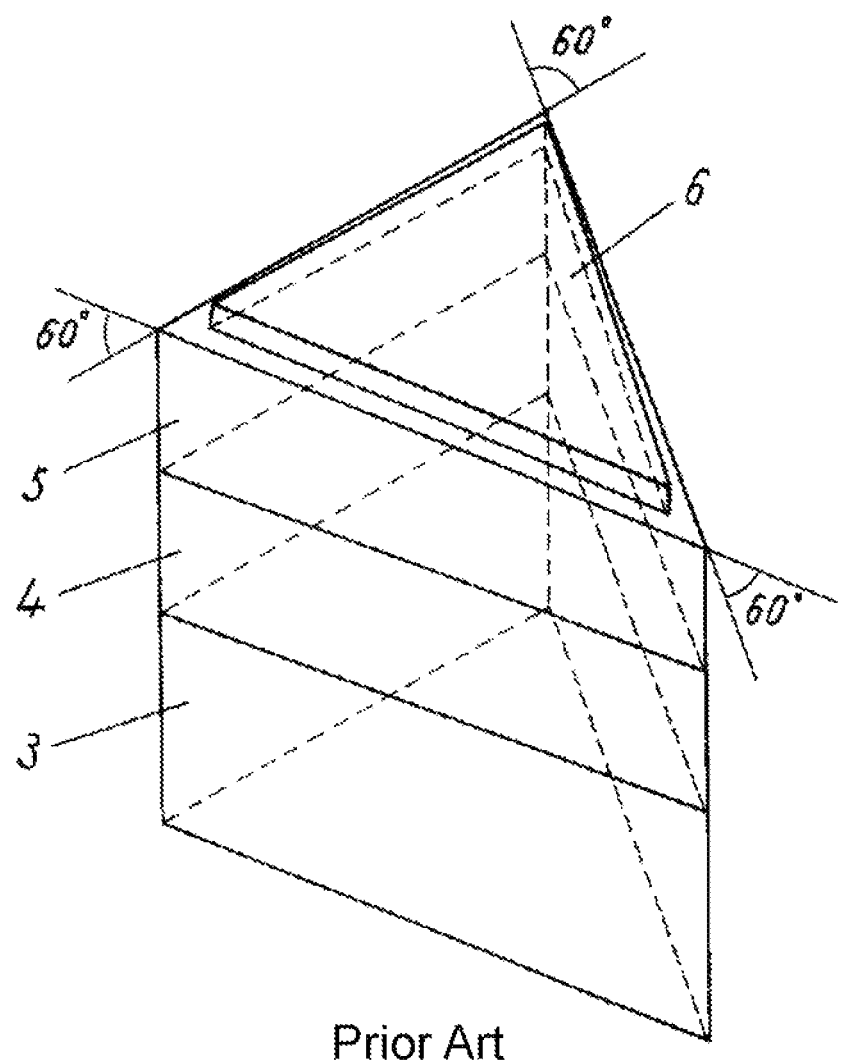
FIG. 24 shows a duplicate of FIG. 1 included in Japanese Patent Application laid-open Publication No. Hei 11-340507A.

FIG. 20 is an enlarged top-view photograph of the nitride semiconductor light-emitting diode according to the comparative example 1. In FIG. 20, similarly to FIG. 16, the nitride semiconductor light-emitting diode was put on the elastic sheet 200 stretched in a c-axis direction and an a-axis direction. As shown in FIG. 20, some of the obtained nitride semiconductor light-emitting diodes were not triangular prismatic. More specifically, the lateral sides of the nitride semiconductor light-emitting diode shown in FIG. 20 were composed of the first side surface 112, the second side surface 122, the first error side surface 124, the second error side surface 126, and the third side surface 132.

Comparative Example 2

A triangular prismatic nitride semiconductor light-emitting diode 130 similar to that of the example 1 was fabricated, expect that Angle X was 45 degrees.

Hereinafter, the term "error occurrence rate" is defined as below.

Error Occurrence Rate=$A/B \times 100$(%)

where

A represents the number of the nitride semiconductor stacking structures each having not only the second side surface 122 but also the first error side surface 124 on the lateral side thereof after the belt-like nitride semiconductor stacking structure 110 has been broken along the second linear groove 104, and B represents the number of the second linear grooves 104 formed on the plate-like nitride semiconductor stacking structure 110.

The error occurrence rates according to the examples 1-3 and the comparative examples 1-2 were calculated. Table 1 shows the error occurrence rates.

TABLE 1

|  | Angle X | Error Occurrence Rate |
|---|---|---|
| Example 1 | 80 | 0 |
| Example 2 | 90 | 0 |
| Example 3 | 75 | 2 |
| Comparative example 1 | 60 | 11 |
| Comparative example 2 | 45 | 29 |

As is clear from Table 1, if Angle X is not less than 75 degrees, the error occurrence rate is a small value of not more than 2%; however, if Angle X is not more than 60 degrees, the error occurrence rate is a large value of not less than 11%.

Accordingly, a triangular prismatic m-plane nitride semiconductor light-emitting diode is fabricated efficiently, if Angle X is not less than 75 degrees.

INDUSTRIAL APPLICABILITY

A triangular prismatic m-plane nitride semiconductor light-emitting diode fabricated in accordance with the method of the present invention can be used for lighting equipment and for a headlight.

REFERENTIAL SIGNS LIST 100 plate-like nitride semiconductor stacking structure
102 first linear groove
104 second linear groove
106 third linear groove
110 belt-like nitride semiconductor stacking structure
112 first side surface
120 quadratic prismatic nitride semiconductor stacking structure
122 second side surface
130 triangular prismatic nitride semiconductor light-emitting diode
132 third side surface
134 p-side electrode
136 n-side electrode
200 elastic sheet
202 blade

The invention claimed is:
1. A method for fabricating a triangular prismatic nitride semiconductor light-emitting diode, the method comprising:
(a) preparing a plate-like nitride semiconductor stacking structure comprising an n-type nitride semiconductor layer, an active layer, and a p-type nitride semiconductor layer; wherein
the active layer is interposed between the n-type nitride semiconductor layer and the p-type nitride semiconductor layer;
the plate-like nitride semiconductor stacking structure has a principal plane of an m-plane;
the principal plane has a first linear groove, a second linear groove, and a third linear groove;
the first linear groove, the second linear groove, and the third linear groove form a triangle in a top view;
the first linear groove has a longitudinal direction substantially parallel to one cleavage axis selected from the group consisting of an a-axis and a c-axis; and
the following formulae (I) to (III) are satisfied:

75 degrees≤Angle $X$≤105 degrees　　(I)

20 degrees≤Angle $Y$　　(II)

20 degrees≤Angle $Z$　　(III)

where
Angle X represents an angle formed between the cleavage axis and a longitudinal direction of the second linear groove;
Angle Y represents an angle formed between the longitudinal direction of the first linear groove and a longitudinal direction of the third linear groove; and Angle Z represents an angle formed between the longitudinal direction of the second linear groove and the longitudinal direction of the third linear groove, (b) breaking the plate-like nitride semiconductor stacking structure, which has been prepared in the step (a), along the first linear groove to form a belt-like nitride semiconductor stacking structure, wherein the belt-like nitride semiconductor stacking structure has a first side surface on a first lateral side thereof; and the first side surface is parallel to the longitudinal direction of the first linear groove;

(c) breaking the belt-like nitride semiconductor stacking structure, which has been formed in the step (b), along the second linear groove to form a quadratic prismatic nitride semiconductor stacking structure, wherein the quadratic prismatic nitride semiconductor stacking structure has the first side surface on the first lateral side thereof and a second side surface on a second lateral side thereof; and the second side surface is parallel to the longitudinal direction of the second linear groove; and (d) breaking the quadratic prismatic nitride semiconductor stacking structure, which has been formed in the step (c), along the third linear groove to form the triangular prismatic nitride semiconductor light-emitting diode, wherein the triangular prismatic nitride semiconductor light-emitting diode has the first side surface on the first lateral side thereof, the second side surface on the second lateral side thereof, and a third side surface on a third lateral side thereof, and the third side surface is parallel to the longitudinal direction of the third linear groove.

2. The method according to claim 1, wherein
the cleavage axis is the a-axis.

3. The method according to claim 1, wherein
the cleavage axis is the c-axis.

4. The method according to claim 1, wherein
Angle X is not less than 80 degrees and not more than 100 degrees.

5. The method according to claim 1, wherein
Angle X is equal to 90 degrees.

6. The method according to claim 1, wherein
the plate-like nitride semiconductor stacking structure has an off-angle; and
the off-angle is more than 0 degrees and not more than 20 degrees.

7. The method according to claim 1, wherein
an angle of not more than 5 degrees is formed between the longitudinal direction of the first linear groove and the cleavage axis.

8. A triangular prismatic nitride semiconductor light-emitting diode comprising an n-type nitride semiconductor layer, a p-type nitride semiconductor layer, and an active layer which is interposed between the n-type nitride semiconductor layer and the p-type nitride semiconductor layer, the triangular prismatic nitride semiconductor light-emitting diode comprising:

a first side surface, a second side surface, and a third side surface which are respectively formed on a first lateral side, a second lateral side, and a third lateral side of the triangular prismatic nitride semiconductor light-emitting diode, wherein a triangle is composed of the first side surface, the second side surface, and the third side surface in a top view;

the first side surface is substantially parallel to one cleavage surface selected from the group consisting of an a-plane and a c-plane;

the triangular prismatic nitride semiconductor light-emitting diode has a principal plane of an m-plane, and the following formulae (I) to (III) are satisfied:

$$75 \text{ degrees} \leq \text{Angle } X \leq 105 \text{ degrees} \quad (I)$$

$$20 \text{ degrees} \leq \text{Angle } Y \quad (II)$$

$$20 \text{ degrees} \leq \text{Angle } Z \quad (III)$$

where

Angle X represents an angle formed between the first side surface and the second side surface in the top view;

Angle Y represents an angle formed between the first side surface and the third side surface in the top view; and Angle Z represents an angle formed between the second side surface and the third side surface in the top view.

9. The triangular prismatic nitride semiconductor light-emitting diode according to claim 8, wherein
the cleavage surface is the a-plane.

10. The triangular prismatic nitride semiconductor light-emitting diode according to claim 8, wherein
the cleavage surface is the c-plane.

11. The triangular prismatic nitride semiconductor light-emitting diode according to claim 8, wherein
Angle X is not less than 80 degrees and not more than 100 degrees.

12. The triangular prismatic nitride semiconductor light-emitting diode according to claim 8, wherein
Angle X is equal to 90 degrees.

13. The triangular prismatic nitride semiconductor light-emitting diode according to claim 8, wherein
the active layer has an off-angle, and
the off-angle is more than 0 degrees and not more than 20 degrees.

14. The triangular prismatic nitride semiconductor light-emitting diode according to claim 8, wherein
an angle of not more than 5 degrees is formed between the first side surface and the cleavage surface in the top view.

* * * * *